United States Patent

Hong et al.

(10) Patent No.: US 6,566,229 B2
(45) Date of Patent: May 20, 2003

(54) METHOD OF FORMING AN INSULATING LAYER IN A TRENCH ISOLATION TYPE SEMICONDUCTOR DEVICE

(75) Inventors: Soo-Jin Hong, Seoul (KR); Moon-Han Park, Yongin-shi (KR); Ju-Seon Goo, Suwon (KR); Jin-Hwa Heo, Inchun (KR); Hong-Gun Kim, Suwon (KR); Eun-Kee Hong, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/991,928

(22) Filed: Nov. 26, 2001

(65) Prior Publication Data

US 2002/0123206 A1 Sep. 5, 2002

(30) Foreign Application Priority Data

Mar. 5, 2001 (KR) ........................................ 2001-11142

(51) Int. Cl.[7] .............................................. H01L 21/76
(52) U.S. Cl. ...................................... 438/435; 438/781
(58) Field of Search ............................... 438/424, 427, 438/435, 780, 781

(56) References Cited

U.S. PATENT DOCUMENTS

| 6,194,283 | B1 | * | 2/2001 | Gardner et al. | ............. | 438/424 |
| 6,232,216 | B1 | * | 5/2001 | Machida et al. | ............ | 438/624 |
| 6,294,833 | B1 | * | 9/2001 | Usami | ......................... | 257/58 |
| 6,489,252 | B2 | * | 12/2002 | Goo et al. | .................. | 438/758 |
| 2002/0055271 | A1 | * | 5/2002 | Lee et al. | ................... | 438/782 |
| 2002/0063334 | A1 | * | 5/2002 | Shin et al. | .................. | 257/758 |
| 2002/0072198 | A1 | * | 6/2002 | Ahn | ............................. | 438/424 |
| 2002/0072246 | A1 | * | 6/2002 | Goo et al. | .................. | 438/758 |
| 2002/0127817 | A1 | * | 9/2002 | Heo et al. | ................... | 438/424 |
| 2002/0168873 | A1 | * | 11/2002 | Ahn et al. | ................... | 438/781 |

FOREIGN PATENT DOCUMENTS

| JP | 05-243223 | * | 9/1993 | ....... | H01L/21/3205 |
| JP | 06-016410 | * | 1/1994 | ........... | C01B/33/02 |
| JP | 2000-183150 | * | 6/2000 | ........... | H01L/21/76 |

OTHER PUBLICATIONS

J. Goo et al., A Highly Manufacturable, Low–Thermal Budget, Void and Seam Free Pre–Metal–Dielectric Process Using New SOG for Beyond 60 nm DRAM and Other Devices. IEDM 2001, pp. 271–274.*

J.H. Lee et al., A Study on ILD Process of Simple and CMP Skip Using Polysilazane–Based SOG. IEEE 2001, pp. 317–320.*

J.H. Heo et al., Void Free and Low Stress Shallow Trench Isolation Technology Using P–SOG for Sub 0.1 micron Device. IEEE 2002, pp. 132–133.*

* cited by examiner

*Primary Examiner*—Wael Fahmy
*Assistant Examiner*—Anh Duy Mai
(74) *Attorney, Agent, or Firm*—Lee & Sterba, P.C.

(57) ABSTRACT

A method of forming a trench-type device isolation layer in which a trench is filled through two steps, wherein a polysilazane solution is coated on a semiconductor substrate, in which a trench for device isolation layer is formed, in a spin on glass (SOG) manner to form an SOG layer filling a predetermined portion of the trench. In order to maintain a conformal coating thickness without overfilling the trench, the polysilazane solution preferably has a solid-state perhydro polysilazane ($[SiH_2NH]n$) of between about 5 to about 15 percent by weight. Following formation of the SOG layer, a subsequent annealing process is carried out. The SOG layer is etched to make a top surface of the remaining SOG layer recessed down to a degree of about 1000 Å from an inlet of the trench, and a remaining space of the trench is filled with an ozone TEOS USG layer or an HDP CVD layer.

14 Claims, 3 Drawing Sheets

METHOD OF FORMING AN INSULATING LAYER IN A TRENCH ISOLATION TYPE SEMICONDUCTOR DEVICE

BACKGROUND OF THE INVENTION

1. Field of the Invention

The present invention relates to a method of forming a device isolation layer in a semiconductor device and, more particularly, to a method of forming a trench-type device isolation layer using an SOG (spin on glass) layer.

2. Description of Related Art

As the integration level of semiconductor devices increases, shallow trench isolation (STI) type device isolation layers are increasingly being used. In a device isolation method employing STI, an oxide layer fills a trench that is formed by etching a semiconductor substrate. The STI technique is used to avoid a "bird's beak" phenomenon resulting from a conventional technique such as local oxidation of silicon (LOCOS).

However, an aspect ratio rises rapidly with the trend toward large scale integration circuits (LSI). In other words, a width of a trench to be filled with a device isolation layer decreases while a depth thereof is maintained at the same level. This arrangement makes it necessary to fill up a trench with a void-free or seam-free silicon oxide layer.

Therefore, various approaches have been made for achieving an oxide layer that is capable of filling up a trench having a high aspect ratio. One of the approaches is to form an oxide layer having excellent gap-fill characteristics using TEOS (tetra-ethyl-ortho-silicate), USG (undoped silicate glass) or HDP (high density plasma). However, if an aspect ratio is 5 or higher, a trench is not fully filled with such an oxide layer. As an alternative, use of a layer of SOG (spin on glass) was proposed. Since the SOG is originally liquid or sol-phase, it has excellent gap-fill characteristics to reduce a step difference. Generally, the SOG is coated on a semiconductor substrate.

As an example, hydro silsesquioxane (HSQ) is an example of a SOG, and generally a liquid-phase HSQ layer is coated on a substrate. The coated HSQ layer is first heated using a low temperature (100° C. to 300° C. ), i.e., soft-baked, to remove any solvent ingredients such as dialkyl ether. The HSQ layer coating is then heated at a high temperature (400° C. ), i.e., hard-baked, for over 10 minutes to harden the HSQ layer coating.

Even if the HSQ layer is subject to a hard-bake process in an oxygen ambient, it is scarcely cured. In this case, "cured" means that an element, except oxygen and silicon, is replaced with oxygen to form silicon oxide. When the SOG layer is used to fill a narrow-and-deep void between patterns, it is hard to diffuse oxygen and an oxygen-combined ingredient. Curing occurs at the top surface of the SOG layer, and consequently, the cured top surface portion of the SOG layer prevents oxygen from diffusing into the HSQ layer. Consequently, crystallization of the HSQ layer into a silicon oxide layer occurs slowly. If the HSQ layer is poorly cured, hydrogen remains in the HSQ SOG layer and causes the formation of a porous layer. When this porous layer is subject to a wet etch, the amount of porous layer that is etched over time increases rapidly leading to instability, unreliability and unpredictability in the etching or cleaning process.

A volume shrinkage may also occur while processing the coated HSQ layer, and this may cause the formation of cracks and fissures in a subsequent annealing process. Compared with a well-cured portion, a stress difference occurs during thermal expansion. This leads to the creation of cracks and therefore a lowering of the reliability of the device. As a result, the HSQ layer is not desirable as a composition layer.

In an effort to overcome the foregoing disadvantages, it has been proposed to form a layer of LPCVD TEOS in a trench that is partially filled with HSQ, see "Shallow Trench Isolation Fill for 1 Gbit DRAM and Beyond Using a Hydrogen Silsesquioxane Glass/LPCVD TEOS Hybrid Approach," contributed to the DUMIC Conference by IBM, 1998. Unfortunately, such an approach requires a separate processing because the conformality of the coating is reduced. If filling a trench with HSQ is beyond a reasonable degree, defects are possibly formed in subsequent process steps.

A method of filling a lower portion of a trench with SOG is disclosed in Japanese Patent Publication No. 2000-183150. First, an organic ingredient is used as SOG to fill a trench for device isolation. In this case, the effects of an oxygen plasma process are not sufficiently transferred to a lower portion of the SOG. This occurs because a plasma-treated upper portion of the SOG is easily etched while a lower portion of the SOG is not or at least insignificantly etched. Thus, the SOG remains at the lower portion of the trench. A remaining portion of the trench is filled with an oxide such as HDP CVD. Such a process is used to fill a trench of a high aspect ratio with an oxide without creating voids or seams. Unfortunately, remaining organic ingredients, such as carbon, have an adverse effect on the insulation of a device isolation layer.

In this regard, the present invention provides a method of forming a trench-type device isolation layer in a trench of a high aspect ratio without the drawbacks and disadvantages of the prior art as described. The present invention also provides a method of forming a trench-type device isolation layer, which can increase a processing margin and enhance characteristics and reliability of products, using spin on glass (SOG) technology.

SUMMARY OF THE INVENTION

According to a preferred embodiment of the present invention, polysilazane is coated on a substrate, in which a trench for device isolation is formed, using a spin on glass (SOG) technique. Using the SOG coating step, the thickness of the coating may be controlled so as to fill only a predetermined portion of the trench with SOG. However, it is preferable that the trench is almost entirely filled with SOG, and then the SOG is etched to a predetermined depth thereby exposing a top portion of the trench. This results in an enhancement of the conformality of the SOG coating.

Preferably, a thin solution containing between about 5 to about 20% polysilizane (a solid-state material decreases in content) is used to maintain a conformal coating thickness without overfilling the trench. More preferably, a polysilazane solution containing between about 5 to about 15 percent by weight, perhydro-polysilazane ([SiH$_2$NH]n), which may be easily annealed at a high temperature, is used.

After formation of the SOG layer, a subsequent process is carried out to turn the SOG layer into a silicon oxide layer of silicon dioxide structure. This subsequent process is divided into two steps, baking and annealing. In the baking step, a solvent in the solution is removed. In the annealing step, an organic ingredient or nitrogen and hydrogen ingredients of the polysilazane are replaced with oxygen to initiate the formation of a silicon oxide layer. Preferably, the annealing step is performed prior to a recess step in which the SOG layer is etched to expose a top portion of the trench. Alternatively, the annealing step may be performed subsequent to the recess step. Preferably, the SOG layer is etched down a thickness of 1000 Å from a top surface of the silicon substrate.

Using a CVD technique, a silicon oxide layer is stacked on a remaining SOG layer in which a trench is partially filled. The CVD oxide layer is preferably made of ozone TEOS USG or HDP CVD having good gap-fill properties. After formation of the silicon oxide layer, a planarization step is further carried out using a CMP technique so as to complete a device isolation layer.

These and other features and aspects of the present invention will be readily apparent to those of ordinary skill in the art upon review of the detailed description that follows.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF A PREFERRED EMBODIMENT

Korean Patent Application No. 2001-11142, filed on Mar. 5, 2001, and entitled: "Method of Forming Insulating Layer in Trench Isolation Type Semiconductor Device," is incorporated herein by reference in its entirety.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
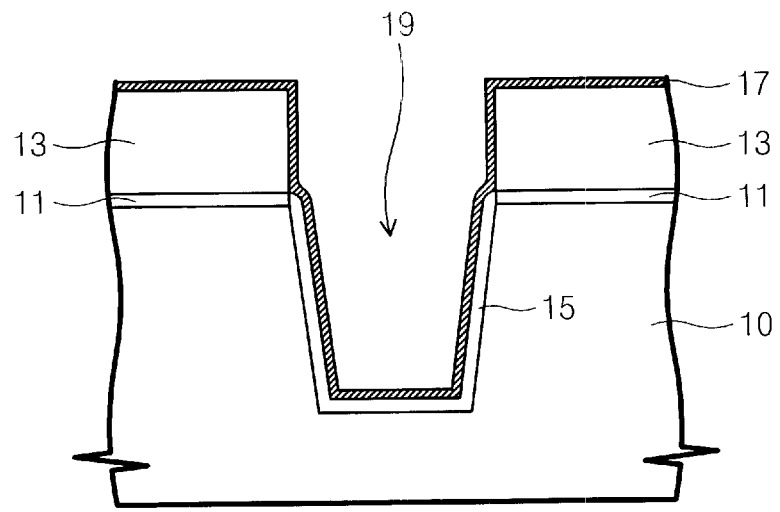
FIG. 1 through FIG. 5 illustrate cross-sectional views of the processing steps of forming a trench-type device isolation layer in accordance with an embodiment of the present invention.

Referring to FIG. 1, a silicon nitride layer (not indicated) is stacked on a semiconductor substrate 10 on which a pad oxide layer 11 is formed. Using a photoresist (not shown), the silicon nitride layer is patterned to form a trench etch mask pattern 13 through exposure and etch steps. Using the trench etch mask pattern 13, the substrate 10 is anisotropically etched to form a trench 19 for device isolation. A thermal oxide layer 15 is formed on an inner wall of the trench to cure any crystalline defects. A silicon nitride liner 17 is formed on the thermal oxide layer to a thickness of about 100 Å or less.

Figure 2:
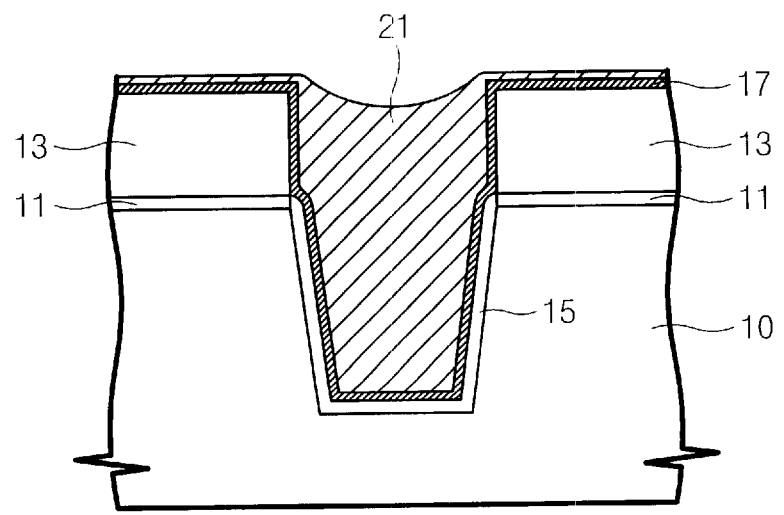

Referring now to FIG. 2, a polysilazane solution is coated on a substrate 10 by a spin on glass (SOG) manner in order to fill a trench. Among the SOG materials, a silazane group ([SiR1R2NR3]n) generally has an average molecular weight between about 1000 to 10,000. Also, the silazane group is perhydro polysilazane in which all the R1, R2, and R3 are hydrogen or is organic polysilazane in which each of the R1, R2, and R3 is an organic atomic group such as alkyl group, aryl group, or alkoxy group. The polysilazane of a constant percent by weight is included in an organic solution such as dibuthyl ether, toluene, and xylene for use as a coating. Such an SOG coating material, conventionally called polysilazane, can be annealed at a relatively lower temperature than a siloxane group, including silicate or silsesquioxane. Therefore, a more complete curing is achieved in order to enhance resistivity to a wet etch. Moreover, such a polysilazane is more easily applied to a process than is HSQ.

The thickness of the SOG layer 21 is determined and controlled by two factors: a solid percent by weight of the polysilazane solution and the speed of a spinner used in coating. When using a low content and viscosity solid (e.g., a solution having a solid content of about 12% in dibuthyl ether), an SOG layer can be formed to fill the most concave portion of a trench with the solution. Also, the SOG layer can be formed, having a low thickness, at a convex portion that is an active region covered with a silicon nitride mask. A thin polysilazane solution is advantageous in achieving a good step coverage. However, if the polysilazane solution is too thin, it is difficult to control the thickness of a layer and also form the SOG layer at one time.

In a preferred embodiment, a coating condition of the polysilazane is that a concentration of the polysilazane is 5 to 15 percent by weight and the spinner is rounded at 1000 to 5000 rpm (revolutions per minute). A trench having a depth of 5000 Å and a width of 1000 Å is filled with the SOG layer 21 at a substantially irregularly-shaped zone in a narrow part of a cell area. A very thin SOG layer (e.g., 500 Å or less, preferably less than 100 Å) is formed at the active region that is covered with an etch mask pattern of a silicon nitride layer. However, the SOG layer is conformally formed in a peripheral circuit area in which a trench or an active region is widely formed. In this case, the SOG layer is gently inclined at an interface.

In coating the polysilazane, a solvent ingredient is removed through a bake process that is one of a pre-bake process (between about 80° C. to 350° C. ), a hard-bake process (approximately 400° C.), or a combination of these processes. In this embodiment, the pre-bake process is carried out for several minutes to remove most of the solvent ingredient. Thereafter, the hard-bake process is carried out to heat a semiconductor substrate at a temperature of 400° C. to 450° C. for 30 minutes. The hard-bake process is carried out in an inert gas, such as nitrogen, or a vacuum ambient. By this procedure, a solvent ingredient and a gas-phase ingredient containing silane gas, nitrogen, and hydrogen issue from the SOG layer.

An annealing process is carried out at a temperature of between about 700° C. to about 800° C. in a steam-supplied oxidation ambient for about an hour, which is called "curing," to form a silicon oxide layer. In this case, silicon-excluded ingredients, for example, organic ingredients, are removed from the polysilazane, and oxygen is introduced to form the silicon oxide layer. Also, the annealing process is preferably carried out in a nitrogen ambient or in an air ambient including oxygen and steam.

Figure 3:
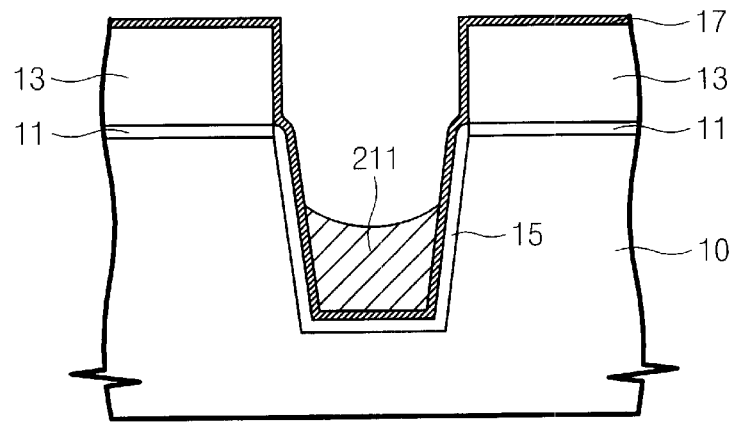

Referring now to FIG. 3, the cured SOG layer 211 is etched to remove a top portion thereof. That is, the cured SOG layer 211 is etched so that the top of the cured SOG layer 211 is recessed below the level of a top surface of the semiconductor substrate. The recess is made to a similar thickness with respect to the entire substrate, making it significant to uniformly coat the SOG layer 211 over the entire substrate. Preferably, the SOG layer 211 is thin and an upper portion of the SOG layer 211 is etched to about 1000 Å from a top surface of the silicon substrate. In this regard, an etch-back technique using a wet or dry etchant is more suitable to the recessing procedure than a chemical mechanical polishing (CMP) technique. A slight recess is advantageous to gap-fill in a subsequent process for filling an oxide layer. Nevertheless, a degree of the recess must be determined considering the fact that the SOG layer 211 is exposed in the following process and is easily attacked under the trench of a high etch rate in an etch or a cleaning process.

Under the premise that the curing is normally made, an upper portion of the SOG layer is changed to a silicon oxide layer while the SOG layer in a deeper part of the trench is oxidized more restrictively. Therefore, an etch rate is easily controllable in recessing an SOG layer from the top surface of the silicon substrate by 1000 Å. For example, using a LAL 2000 solution that contains hydrofluoric acid and ammonium hydroxide, which etches a thermal oxide layer at a rate of about 200 Å/minute, the SOG layer is etched at a rate of about 600 Å/minute. This result is higher than that of the thermal oxide layer but is controllable in comparison with the conventional HSQ SOG layer.

Figure 4:
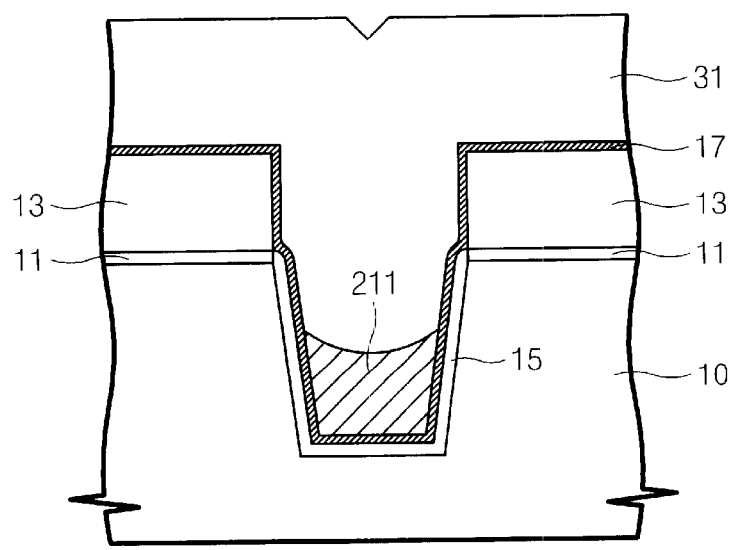

Referring now to FIG. 4, a silicon oxide layer 31 is deposited on a substrate in which an SOG layer 211 is recessed in a trench. The deposition of the silicon oxide layer 31 is made by, for example, the HDP CVD manner of a high gap-fill capability. In this case, a deposition thickness is sufficient to cover the entire substrate. Conventionally, a process of densifying the CVD silicon oxide layer is subsequent. By the CMP technique, however, the CVD silicon oxide layer is planarized to expose the trench etch mask pattern 13.

Figure 5:
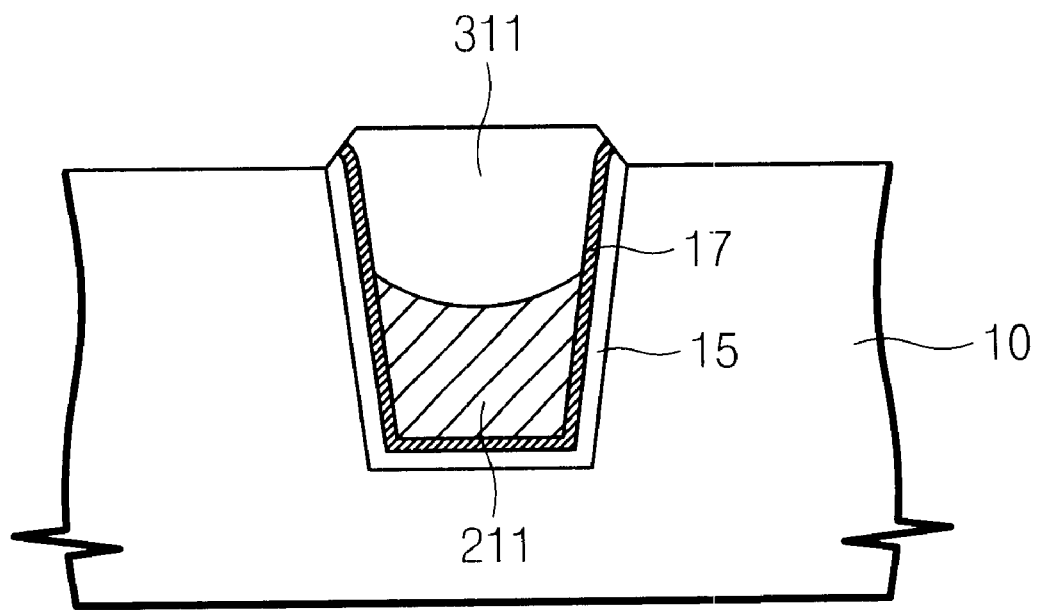

Referring now to FIG. 5, a silicon nitride layer used as a trench etch mask pattern 13 and a pad oxide layer 11 are removed to complete a trench-type device isolation layer that is composed of a lower SOG layer 211 and an upper silicon oxide layer 311. Preferably, the device isolation layer filling the trench is partially etched to be level with the substrate.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a trench-type device isolation layer, comprising:
    coating a polysilazane solution on a semiconductor substrate in a spin on glass (SOG) manner to form an SOG layer filling a trench formed in the semiconductor substrate for device isolation;
    performing a thermal process for changing an upper portion of the SOG layer to a silicon oxide layer;
    etching the thermally treated SOG layer to form a remaining SOG layer filling a predetermined portion of the trench, such that a top surface of the remaining SOG layer is recessed from a top surface of the semiconductor substrate by about 1000 Å; and
    stacking a CVD type silicon oxide layer on the remaining SOG layer to fill a remaining portion of the trench.

2. A method of forming a trench-type device isolation layer, comprising:
    coating a polysilazane solution on a semiconductor substrate in a spin on glass (SOG) manner to form an SOG layer filling a trench formed in the semiconductor substrate for device isolation, wherein a solid ingredient of the polysilazane solution is between about 5 to about 20 percent by weight and the SOG layer is coated on an active region around the trench to a thickness of about 500 Å or less;
    performing a thermal process for changing an upper portion of the SOG layer to a silicon oxide layer;
    etching the thermally treated SOG layer to form a remaining SOG layer filling a predetermined portion of the trench; and
    stacking a CVD type silicon oxide layer on the remaining SOG layer to fill a remaining portion of the trench.

3. The method as claimed in claim 2, wherein the subsequent thermal process consists of a bake process and an annealing process that is performed in a steam ($H_2O$)-supplied oxidation ambient at a temperature of between about 700° C. to about 800° C. for between about 10 to about 60 minutes.

4. The method as claimed in claim 2, wherein the polysilazane solution contains only a solid-state perhydro polysilazane ($[SiH_2NH]n$) of between about 5 to about 15 percent by weight.

5. The method as claimed in claim 2, wherein the CVD type silicon oxide layer is formed using a high density plasma (HDP) CVD.

6. The method as claimed in claim 5, further comprising planarizing the silicon oxide layer in a chemical mechanical polishing (CMP) manner after the formation thereof.

7. The method as claimed in claim 2, wherein the thermal process includes a bake process and an annealing process that is performed in a steam ($H_2O$) and a nitrogen ($N_2$)-supplied oxidation ambient at a temperature of between about 700° C. to about 800° C. for between about 10 to about 60 minutes.

8. A method of forming a trench-type device isolation layer, comprising:
    stacking a pad oxide layer on a silicon substrate;
    stacking a silicon nitride layer on the pad oxide layer;
    patterning the silicon nitride layer to form a trench etch mask pattern;
    etching the pad oxide layer and the substrate to form a trench for device isolation;
    forming a thermal oxide layer on an inner wall of the trench such that the thermal oxide layer covers a bottom and sidewalls of the trench to a level that is even with the silicon nitride layer so that the trench has a convex portion that is an active region at the sidewall of the trench where the pad oxide layer meets the silicon nitride layer;
    forming a silicon nitride liner on the entire substrate including the thermal oxide layer;
    coating a polysilazane solution on the semiconductor substrate in a spin on glass (SOG) manner to form an SOG layer filling the trench formed in the semiconductor substrate for device isolation, wherein a solid ingredient of the polysilazane solution is between about 5 to about 20 percent by weight and the SOG layer is coated on the convex portion of the trench that is an active region to a thickness of about 500 Å or less;
    performing a thermal process for changing an upper portion of the SOG layer to a silicon oxide layer;
    etching the thermally treated SOG layer to form a remaining SOG layer filling a predetermined portion of the trench;
    stacking a CVD type silicon oxide layer on the remaining SOG layer to fill a remaining portion of the trench; and
    removing the silicon nitride layer and pad oxide layer.

9. The method as claimed in claim 8, wherein the subsequent thermal process consists of a bake process and an annealing process that is performed in a steam ($H_2O$)-supplied oxidation ambient at a temperature of between about 700° C. to about 800° C. for between about 10 to about 60 minutes.

10. The method as claimed in claim 8, wherein the SOG layer is etched to make a top surface of the remaining SOG layer recessed from a top surface of the semiconductor substrate by about 1000 Å.

11. The method as claimed in claim 8, wherein the polysilazane solution contains only a solid-state perhydro polysilazane ($[SiH_2NH]n$) of between about 5 to about 15 percent by weight.

12. The method as claimed in claim 8, wherein the CVD type silicon oxide layer is formed using a high density plasma (HDP) CVD.

13. The method as claimed in claim 12, further comprising planarizing the silicon oxide layer in a chemical mechanical polishing (CMP) manner after the formation thereof.

14. The method as claimed in claim 8, wherein the subsequent process includes a bake process and an annealing process that is performed in a steam ($H_2O$) and a nitrogen ($N_2$)-supplied oxidation ambient at a temperature of between about 700° C. to about 800° C. for between about 10 to about 60 minutes.

* * * * *